United States Patent [19]

Saito

[11] 4,370,699

[45] Jan. 25, 1983

[54] PRINTED WIRING BOARD FOR RECORDING OR DISPLAYING INFORMATION

[75] Inventor: Tamio Saito, Oume, Japan

[73] Assignee: Tokyo Shibaura Denki Kabushiki Kaisha, Kawasaki, Japan

[21] Appl. No.: 211,450

[22] Filed: Nov. 28, 1980

[30] Foreign Application Priority Data

Nov. 28, 1979 [JP] Japan .................. 54/153857

[51] Int. Cl.$^3$ ............................... H05K 1/16
[52] U.S. Cl. .................... 361/406; 219/216; 219/543; 361/404
[58] Field of Search ........ 361/404, 406; 219/216, 219/216 PH, 543

[56] References Cited

U.S. PATENT DOCUMENTS

| | | | |
|---|---|---|---|
| 3,923,581 | 12/1975 | Payne | 361/411 X |
| 4,055,743 | 10/1977 | Conta | 219/216 |
| 4,099,046 | 7/1978 | Boynton | 219/216 |
| 4,118,757 | 10/1978 | Rinaldo | 361/404 |
| 4,141,018 | 2/1979 | Mizuguchi | 219/216 X |

Primary Examiner—R. R. Kucia
Attorney, Agent, or Firm—Schuyler, Banner, Birch, McKie & Beckett

[57] ABSTRACT

This disclosure concerns printed wiring boards for recording or displaying information. The printed wiring board comprises an insulated substrate, a plurality of functional elements placed on the insulated substrate, a plurality of strip wires formed on the insulated substrate, each of the strip wires connected to a respective functional element, and at least two of the strip wires having different lengths such that one is longer than the other, each of the strip wires comprising a first portion having a first resistivity and a second portion having a second resistivity which is higher than the first resistivity, wherein the resistance of the second portion of the shorter strip wire is higher than the resistance of the second portion of the longer strip wire.

16 Claims, 16 Drawing Figures

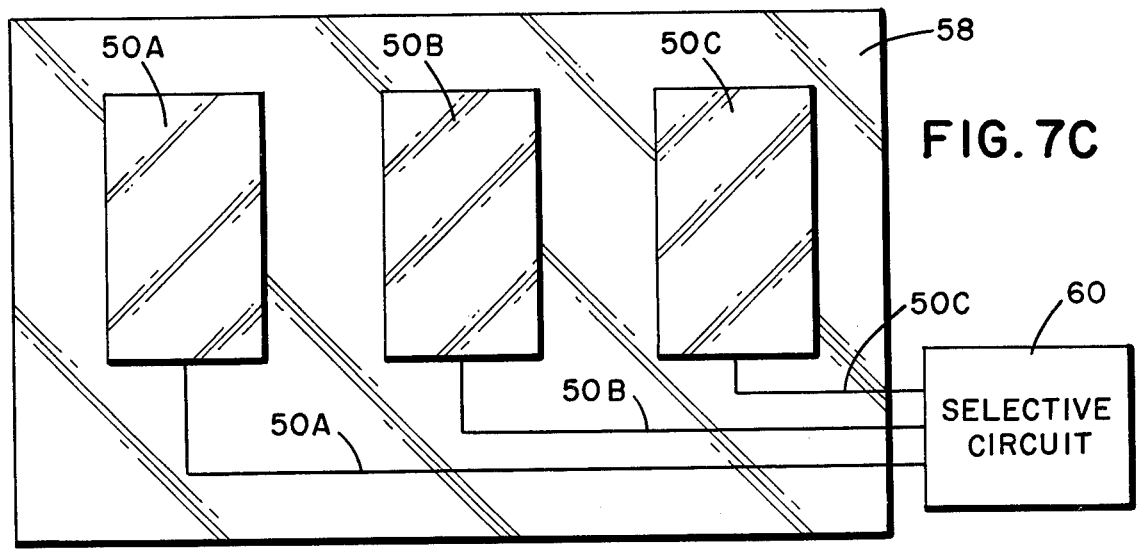
FIG. 7C
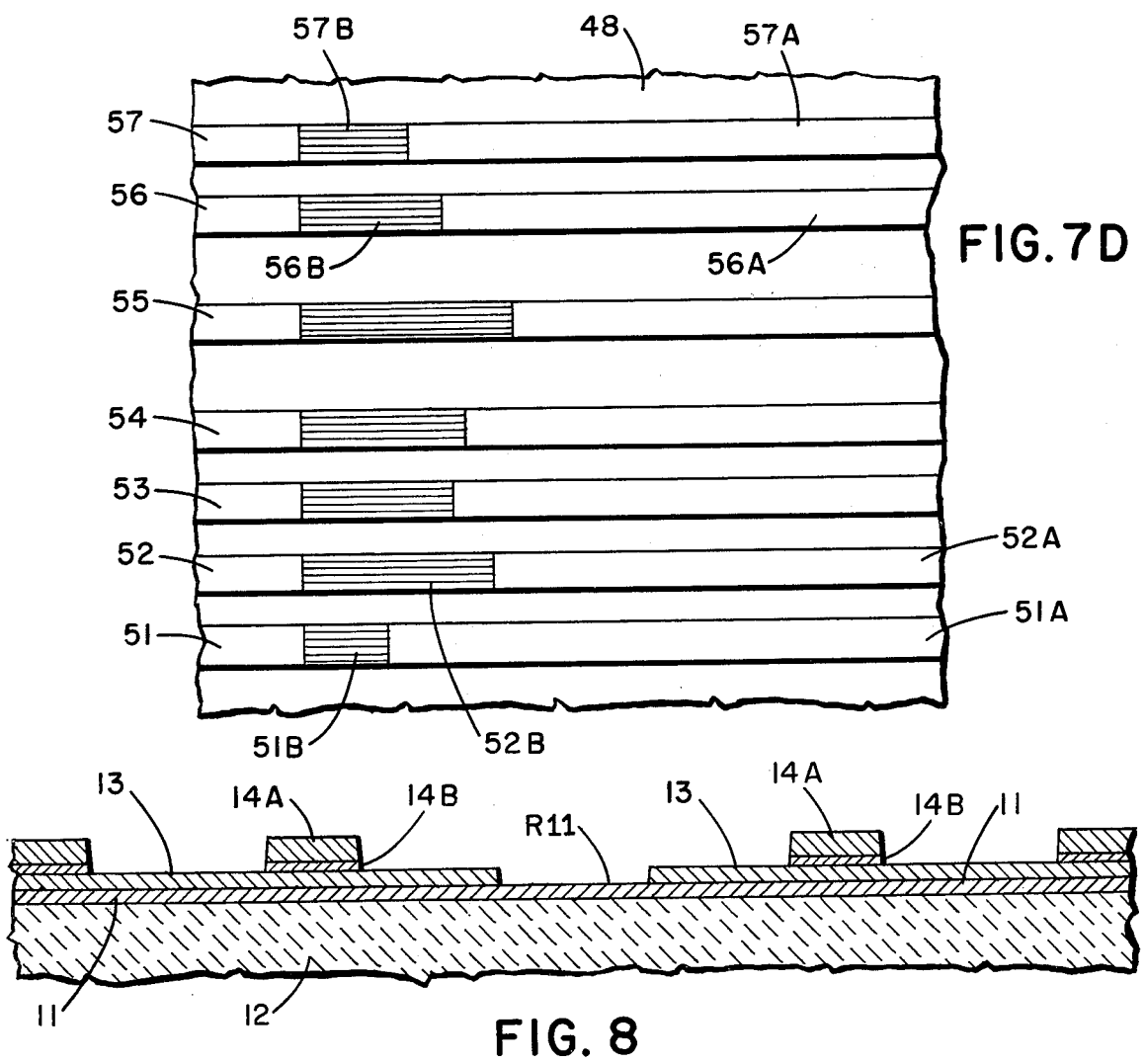
FIG. 7D
FIG. 8

PRINTED WIRING BOARD FOR RECORDING OR DISPLAYING INFORMATION

BACKGROUND OF THE INVENTION

This invention relates to printed wiring boards for recording or displaying information comprising a substrate, functional elements placed on the substrate, and strip wires connected to the functional elements. In particular, the invention is directed to an improvement for correcting resistance unbalance of strip wires due to the different lengths of strip wires employed.

There is a printed wiring board which comprises an insulated substrate, functional elements placed on the substrate, and strip wires connected to the functional elements. For example, the invention can be utilized with a thermal printing head which comprises an insulated substrate, a plurality of thermal resistive elements aligned on the substrate, and a plurality of strip wires formed on the substrate and connected to the thermal resistive elements. Moreover, the invention can be utilized with a liquid crystal display apparatus which comprises two substrates, having the liquid crystal sandwiched between the two substrates, a plurality of electrodes formed on the substrate, and a plurality of strip wires formed on the substrates and connected to the electrodes. In such an apparatus, a functional element consists of electrodes facing one another and a liquid crystal positioned between the electrodes.

In either of these above described printed wiring board embodiments, the length of the strip wires connected to the functional elements on the substrate depends upon the positions of the elements vis-a-vis the electric source. Consequently, strip wires having various lengths are the inevitable result. When the area of the substrate upon which the functional elements are placed is small, the differential length of the longest strip wire and shortest strip wire is small. However, because printed wiring boards having a larger area of formed elements are more useful in a printing or displaying apparatus, such boards have been more frequently used. Therefore, the differential length of the longest wire and the shortest strip wire can not be ignored.

The larger the differential length of the longest and shortest strip wires or the larger the differential width of the strip wires, an increase in the differential resistance will occur. As a result, the voltage or electric current supplied to each functional element will not be uniform. In the case of thermal resistive printing elements, undesirable copies will be obtained which have a remarkable contrast in printing density. That is, the copies will have light and dark printed portions. In the case of liquid crystal display elements the displayed image will have light and dark density portions.

For example, in the thermal head circuit shown in FIG. 1, thermal resistive elements are formed on a substrate. These elements Rij are aligned on the substrate, wherein one end of these elements are connected to respective positional selective terminals Bi by strip wires. The terminals are connected via semiconductor diodes Dij to prevent leakage of current. As shown in FIG. 1, there are seven terminal groups (B1, B2 ... ) each consisting of five thermal resistive elements (R11, R12 ... ) such that i=1, 2, ..., 7 and j=1, 2, ..., 5. The other end of thermal resistive elements Rij are connected to signal terminals Cj. In operating an element, the selected terminals Bi is grounded and the activating recording signal is supplied to one or more of the five thermal resistive elements Ri1 ... Ri5 via the appropriate signal terminals C1 ... C5 in parallel. For example, if selected terminal B1 is grounded and negative voltage is supplied into signal terminals C2, C4, thermal resistive elements R12 and R14 of group R11 ... R15 will be activated to print an image.

In the thermal printing head shown in FIG. 1, the length of the strip wires between the elements and their respective signal terminals are different. The strip wire between thermal resistive element R11 and signal terminal C1 is the shortest, while the strip wire between thermal resistive element R75 and signal terminal C5 is the longest. The difference in length of these strip wires is L1+L2. The longer L1+L2 becomes, the more severity in density contrast will result. Length L1 defines a boarder of the recordable area (i.e. the area in which printing takes place). Therefore, the longer the recordable area, the larger the differential resistance of the longest and shortest wire, thereby resulting in a more severe density contrast.

SUMMARY OF THE INVENTION

It is one object of this invention to provide a printed wiring board for recording or displaying information whereby uniform density of the resultant image is obtained.

It is another object of this invention to provide a printed wiring board having a plurality of strip wires whereby the differential resistance among the wires is negligible.

According to this invention, the foregoing and other objects are attained by providing a printed wiring board for recording or displaying information comprising, an insulated substrate, a plurality of functional elements placed on the substrate, and a plurality of strip wires formed on the substrate, each of the strip wires connected to a respective functional element, and at least two of the strip wires having different lengths such that one is longer than the other, each of the strip wires comprising a first portion having a first resistivity and a second portion having a second resistivity which is higher than the first resistivity, wherein the resistance of the second portion of the shorter strip wire is higher than the resistance of the second portion of the longer wire.

BRIEF DESCRIPTION OF THE DRAWINGS

Other objects and features of the invention will become apparent to those skilled in the art as the disclosure is made in the following description of a preferred embodiment of the invention, as illustrated in the accompanying sheet of drawings, in which:

FIG. 7C shows a plan view of a transparent substrate containing strip wires of an embodiment applied to a display apparatus;

FIG. 7D shows an enlarged view of the strip wires shown in FIG. 7A; and

FIG. 8 shows a sectional view of a thermal printing head embodiment wherein the upper layer of a two layer strip wire contains two further layers.

DESCRIPTION OF THE PREFERRED EMBODIMENTS

Figure 2A:
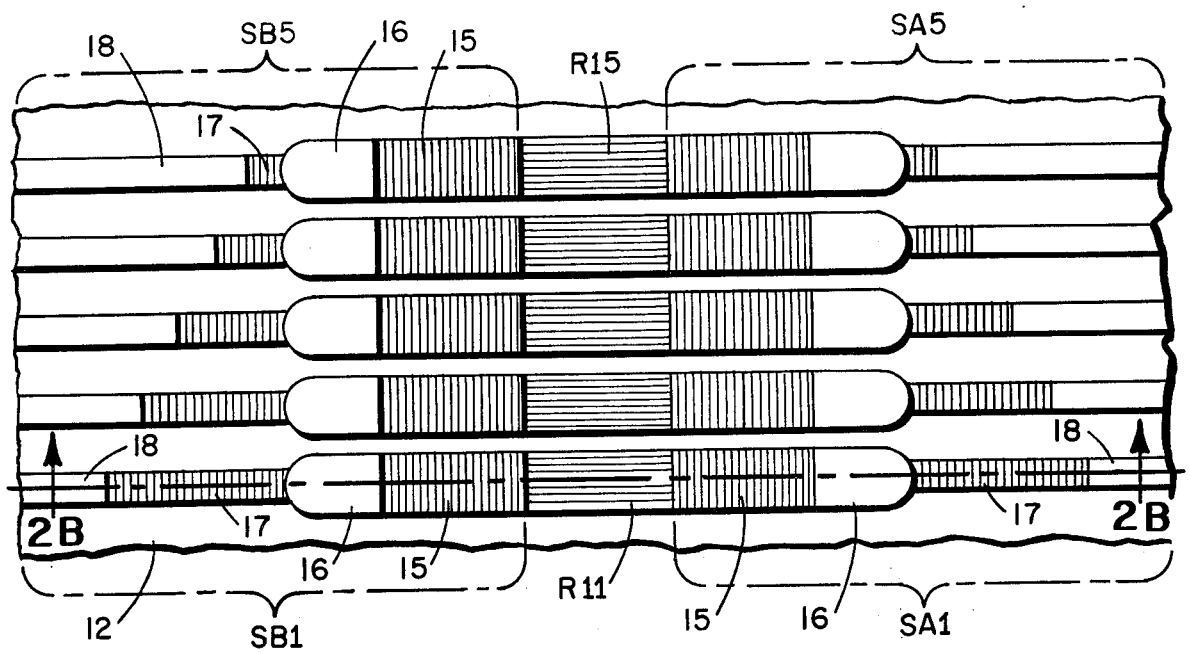
FIG. 2A shows a plan view of strip wires of an embodiment applied to thermal printing heads.
Figure 2B:
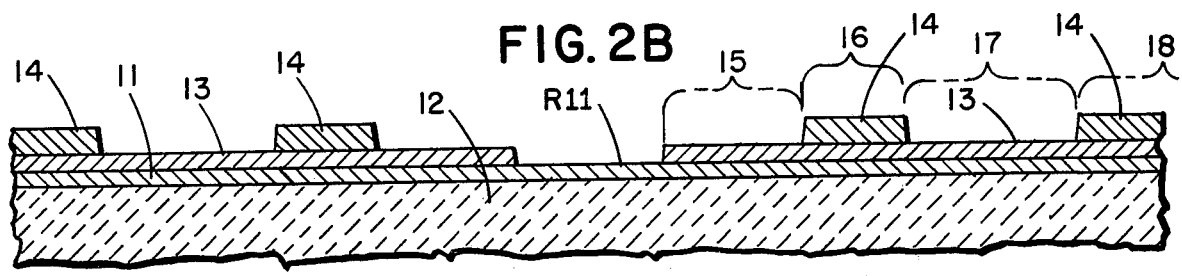
FIG. 2B shows a sectional view along line A—A' of FIG. 2A.

One preferred embodiment of the present invention is shown in FIGS. 2A and 2B. A plurality of resistive layers 11 are formed along insulated substrate 12 such as a ceramic substrate. Resistive layers 11 are formed of Ta-SiO$_2$. A plurality of conductive fixing layers 13 are formed on resistive layers 11 except for the area selected as heating portions R11-R15. Layer 13 is found to have a wide portion 15 and a narrow portion 17. For example, conductive fixing layer 13 is made of Cr and measures approximately 1000 Å in thickness; the wide portion adjacent the heating elements has a width of approximately 100 μm while the narrow portion has a width of approximately 50 μm. A plurality of conductive layers 14 are formed as segments along both the wide and narrow portions of conductive fixing layers 13. Conductive layer 14 is applied to the narrow portion such that the exposed length 17 of each narrow portion of conductive fixing layers 13 has a different length. As shown in FIG. 2A, conductive layers 14 and exposed fixing layers 15 and 17 of fixing layer 13 correspond to strip wires SA1 . . . SA5, SB1 . . . SB5. Conductive layer 14, for example, is made of Au and measures approximately 3 μm in thickness. The resistivity of conductive layers 14 is lower than conductive layers 13.

Figure 1:
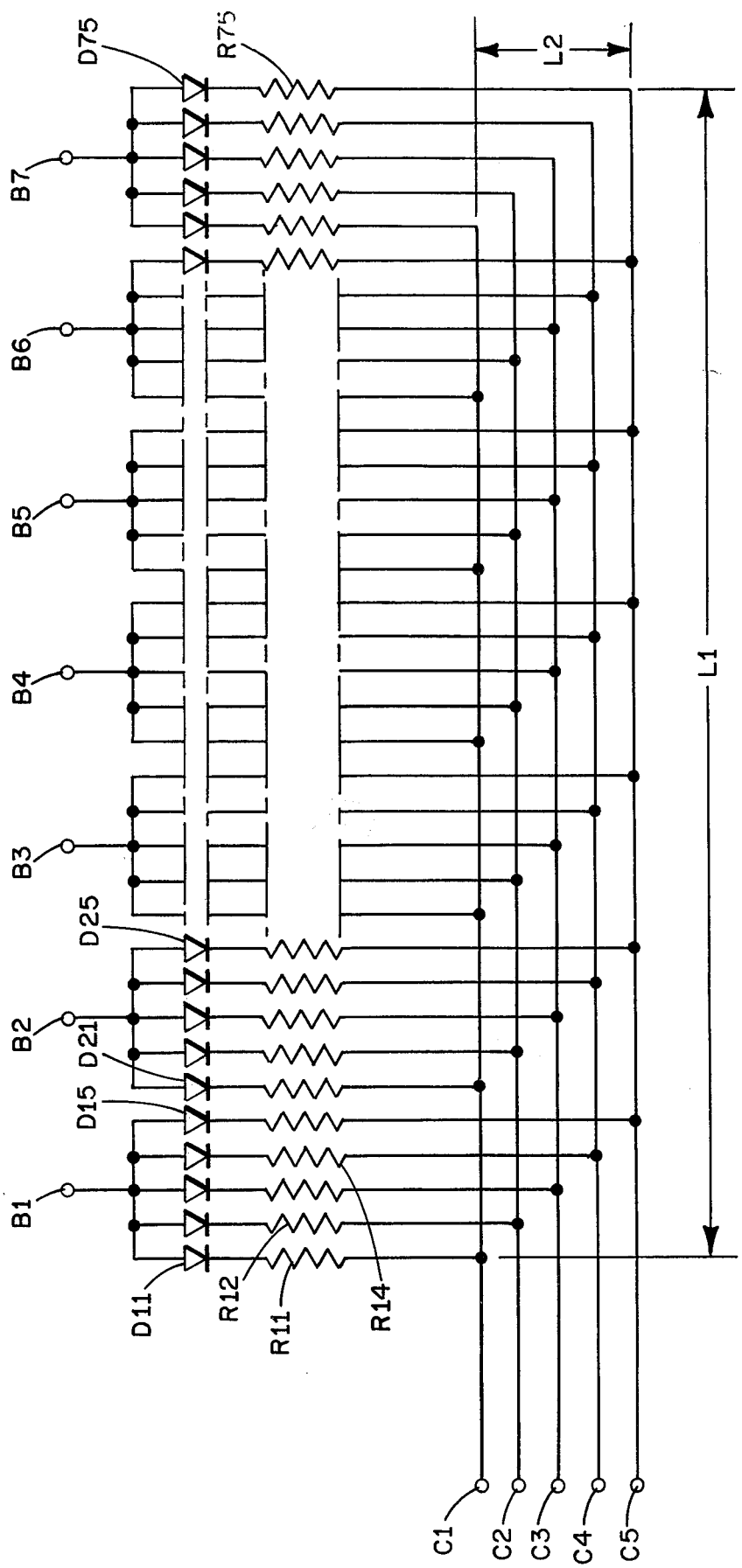
FIG. 1 shows a wiring diagram of a thermal printing head.

Each heating portion comprises a thermal resistive element. Thermal resistive element R11 is connected to signal terminal C1 by strip wire SA1 and to diode D11 by strip wire SB1 (See FIGS. 1, 2A). Thermal resistive element R12 is connected to signal terminal C2 by strip wire SA2 and to diode D12 by strip wire SB2. Similarly, thermal resistive element R15 is connected to signal terminal C5 by strip wire SA5 and to diode D15 by strip wire SB5.

Each strip wire comprises a heat preventive portion 15, a connection portion 16, an adjusting portion 17, and a leading portion 18. Heat preventive portion 15, measuring approximately 100 μm in width, comprises only conductive fixing layer 13 and is connected to thermal resistive element. Connecting portion 16, measuring approximately 100 μm in width, comprises only conductive fixing layer 13 and conductive layer 14 and is connected to heat preventive portion 15. Adjusting portion 17 measuring 50 μm in width, comprises conductive fixing layer 13 and is connected to connecting portion 16. Leading portion 18, measuring approximately 50 μm, comprises conductive fixing layer 13 and conductive layer 14 and is connected to adjusting portion 17 and one of signal terminals C1 . . . C5. The length of leading portions 18 are long and are generally assembled in a multi-layer structure wherein each lead layer is separated by an insulator (not shown).

Since the resistivity of conductive layer 14 is lower than conductive fixing layer 13, most of the applied electrical current will pass through conductive layer 14 bypassing that portion of conductive fixing layer 13 below layer 14. Due to the difference in length among leading portions 18, the resistance of the strip wires will be different. However, by adjusting the resistance of each strip wire, equal resistance among the wires can be obtained. In this embodiment, for example, the resistance of strip wire SA1 is adjusted by changing the length of adjusting portion 17 of strip wire SA1 and SB1. In the above embodiment, by adjusting portion 17 to adjust the resistance of the strip wire is formed along the narrow portion of layer 13, the resistance of each strip wire can be made equivalent. As a result, an unbalance in the heating of each resistive element can be avoided.

Figure 3A:
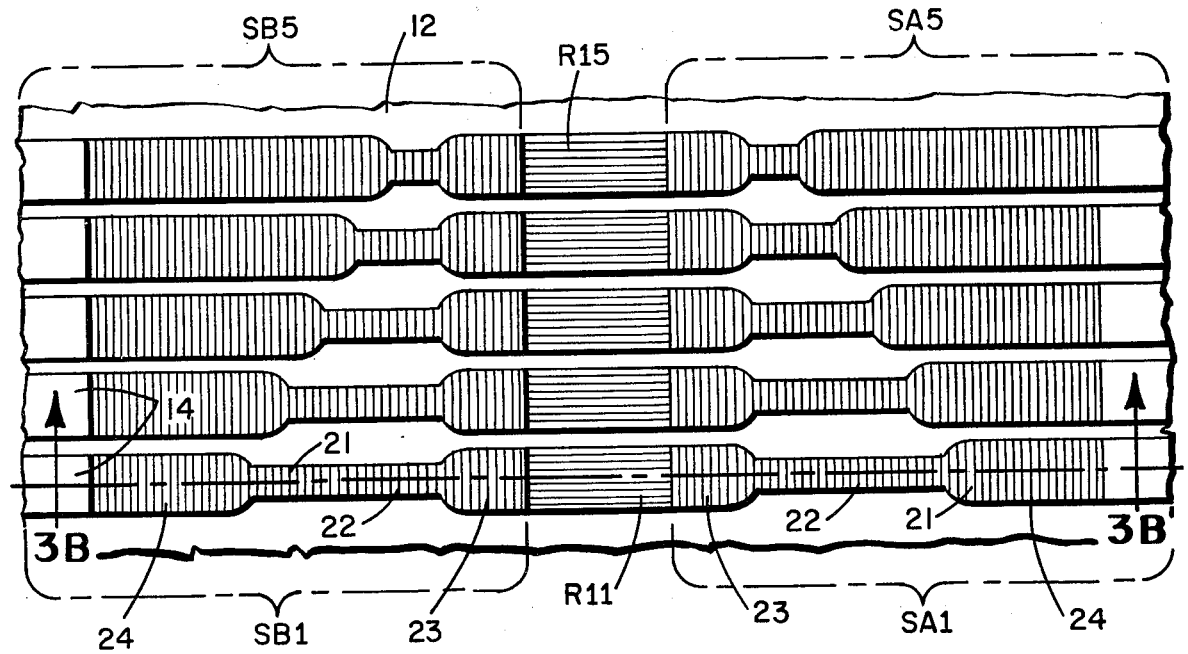
FIG. 3A shows a plan view of strip wires of another thermal printing head embodiment.
Figure 3B:
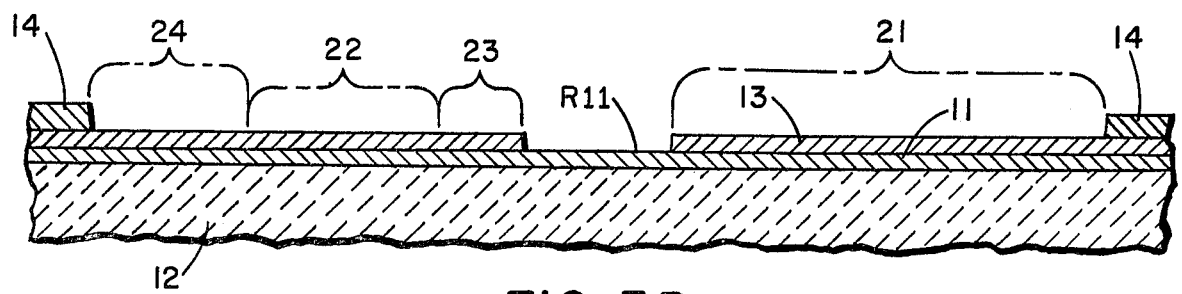
FIG. 3B shows a sectional view along line A—A' of FIG. 3A

Another embodiment of the present invention is shown in FIGS. 3A and 3B. In this embodiment, each strip wire comprises a single layer portion made of conductive fixing layer 13, and two layer portion made of conductive fixing layer 13 and conductive layer 14, as in the above embodiment shown in FIGS. 2A and 2B. However, each single layer portion 21 is positioned between the thermal resistive element and the two layer portion and comprises a narrower portion 22 which is smaller in cross-section than portions 23 and 24. The length of the narrow portion 22 of each wire is different. For example, narrow portion 22 of strip wire SA1 is longer than narrow portion 22 of strip wire SA5. This permits an adjustment of the resistance of each strip wire so that it can be made equivalent.

This embodiment has an advantage that the figure changes of strip wires are small because the resistances of strip wires are adjusted at the narrow portion.

In each of the above embodiments, the resistance of the strip wire is adjusted at the narrow portion of each single layer. However, the resistance can be adjusted at the larger cross-sectional portion.

Figure 4A:
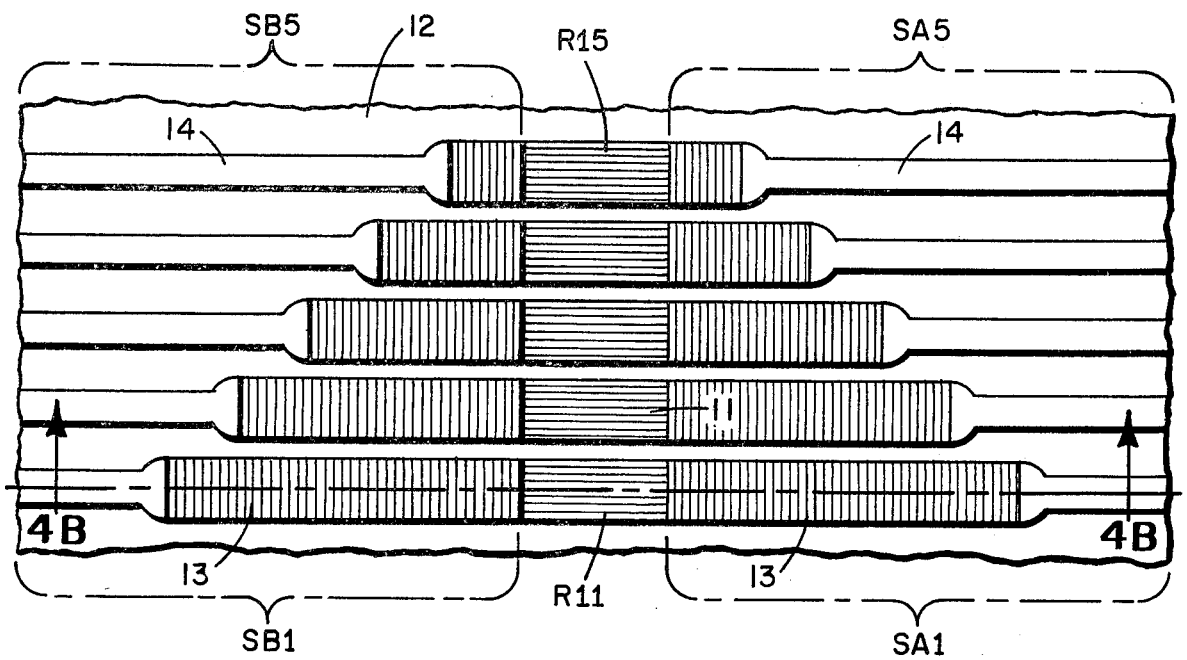
FIG. 4A shows a plan view of strip wires of still another thermal printing head embodiment.
Figure 4B:
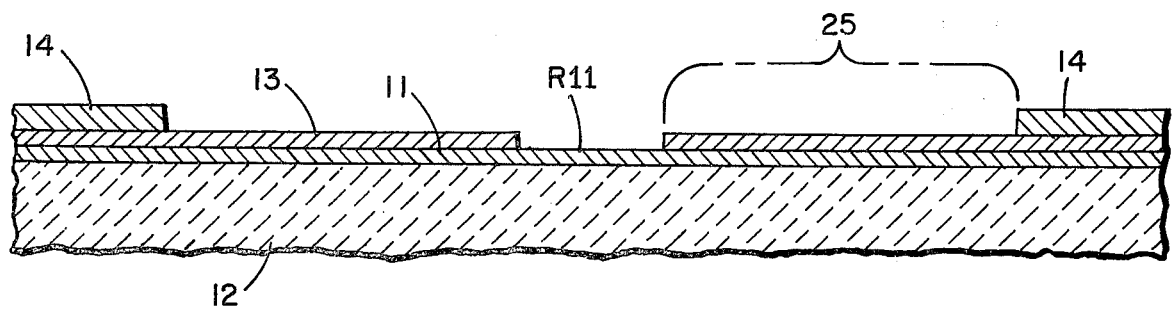
FIG. 4B shows a sectional view along line A—A' of FIG. 4A.

Another embodiment of the invention is shown in FIGS. 4A and 4B. In this embodiment, each single layer portion 25 is made of conductive fixing layer 13 and has relatively broad width of approximately 100 μm. The single layer portion 25 of each strip wire is made to have a different length. For example, single layer portion 25 of strip wire SA1 is made longer than single layer portion 25 of strip wire SA5. However, the difference of length is greater than that shown in FIG. 2A or 3A, since the single layer portion of 4A is broader than the single layer portion of FIG. 2A or 3A.

Figure 5A:
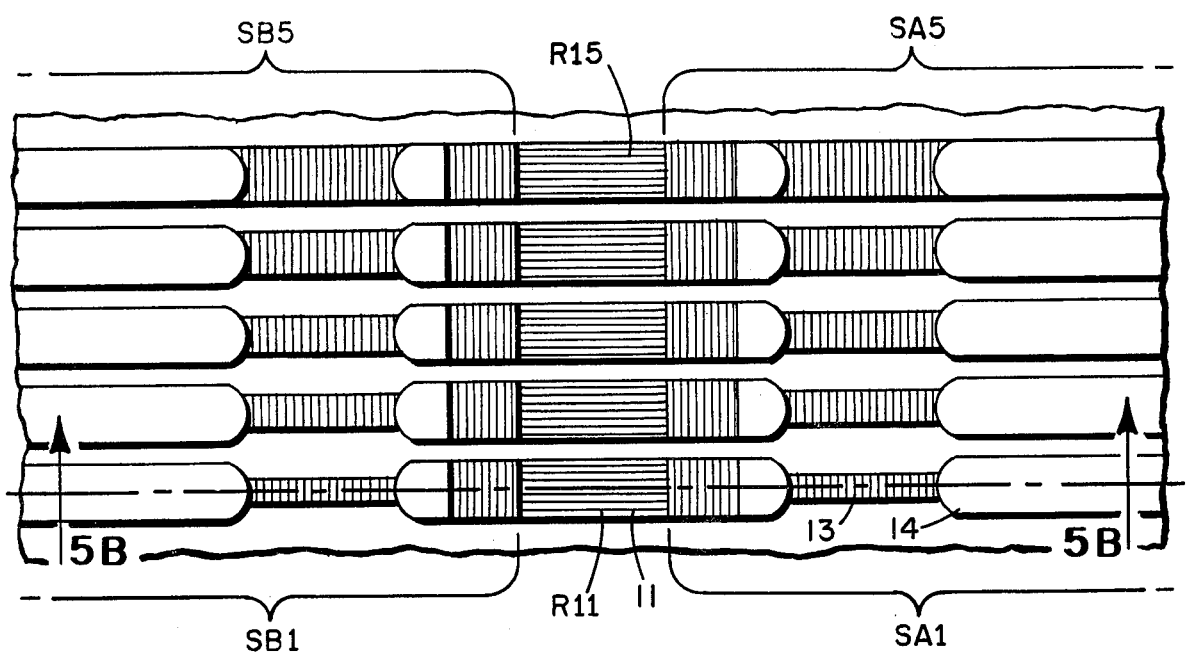
FIG. 5A shows a plan view of strip wires of a further printing head embodiment.
Figure 5B:
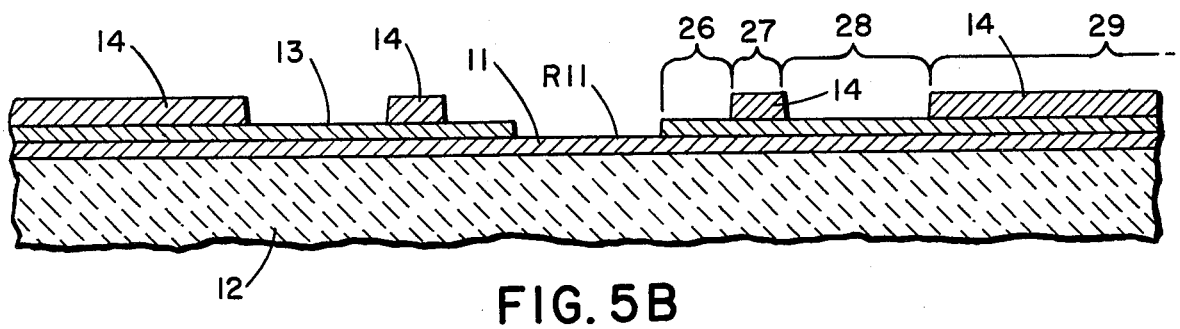
FIG. 5B shows a sectional view along line A—A' of FIG. 5A.

In the above embodiments, the length of the single layer portion is changed to adjust the resistance of strip wire. Moreover, the width of the single layer portion can be changed to adjust the resistance, as shown in FIGS. 5A and 5B. Each strip wire comprises a heat preventive portion 26, a connecting portion 27, an adjusting portion 28, and a leading portion 29 as in the case with the embodiment shown in FIGS. 2A and 2B. However, adjusting portion 28 is different than the adjusting portion 17 shown in FIGS. 2A and 2B. The adjusting portion 28 of each strip wire has a width which is different.

In each of the above embodiments, conductive fixing layer 13 and conductive layer 14 are made of Cr and Au. However, a conductive material selected from the group consisting of Ti, V, W, Nb, and Mo can be used as conductive fixing layer 13. Moreover, a conductive material selected from the group consisting of Cu, Al, Pt and Ni can be used as conductive layer 14. Further, as shown in FIG. 8, two layers can be used. Conductive layer 14 consists of a layer 14A of Au and a layer 14B of Pd or Ni. For example, adjusting portion 28 of strip wire SA1 is narrower than adjusting portion 28 of strip wire SA5.

Figure 6A:
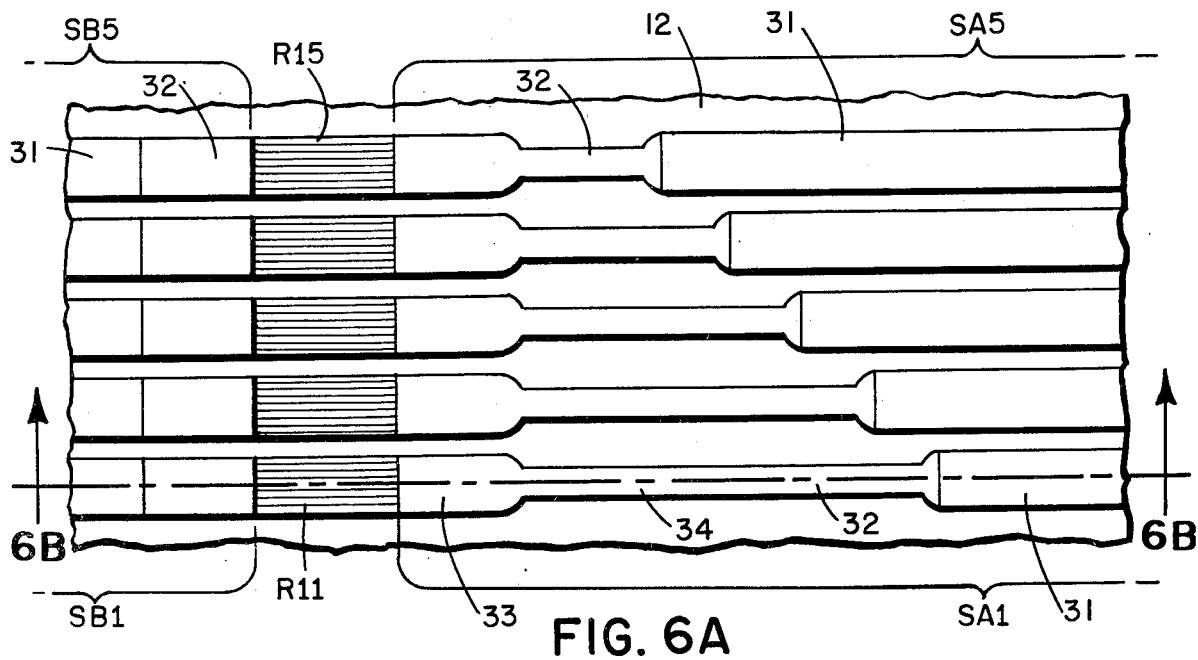
FIG. 6A shows a plan view of strip wires of still a further printing head embodiment.
Figure 6B:
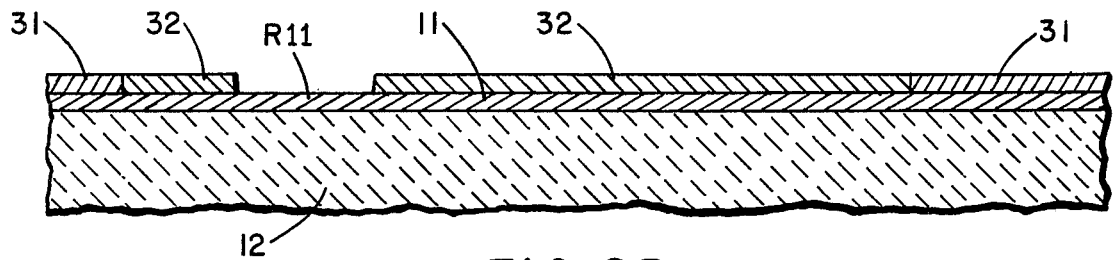
FIG. 6B shows a sectional view along line A—A' of FIG. 6A.

In all of the above embodiments, each strip wire comprises a single layer portion and a two layer portion. However, the present invention is applicable to a thermal printing head having strip wires which comprise a single layer. Such an embodiment is shown in FIGS. 6A and 6B. A plurality of resistive layers 11 are aligned on an insulated substrate 12 such as a ceramic substrate. First portion 31 and second portion 32 are selectively formed on resistive layer 11 corresponding to each strip wire as shown in FIGS. 6A and 6B. The resistivity of each second portion 32 is higher than the resistivity of each first portion 31. In this embodiment, strip wires SA1 . . . SA5 connected between the thermal resistive elements and signal terminals C1 . . . C5 are not similar to strip wires SB1 . . . SB5 connected between thermal resistive elements and diodes D11 . . . 15. Each of strip wires SA1 . . . SA5 contains a second portion 32 which comprises a heat preventive portion 33 and a narrow adjusting portion 34. Each of strip wires SB1 . . . SB5 contains a second portion which comprises only a heat preventive portion 33. Different lengths of adjusting portion 34 of strip wire SA1 . . . SA5 are utilized. In this embodiment, the resistance of strip wires SA1 . . . SA5 are adjusted at adjusting portion 34 of strip wires SA1 . . . SA5. Therefore, the difference in length of each adjusting portion 34 is relatively long in comparison with embodiments shown in FIGS. 3A and 3B. In this embodiment, it is possible to adjust the resistance of strip wires by changing the width of each adjusting portion in the same manner as the embodiment shown in FIGS. 5A and 5B. Generally, it is possible to substitute an insulated substrate for a substrate having at least a surface layer of insulated material.

Figure 7A:
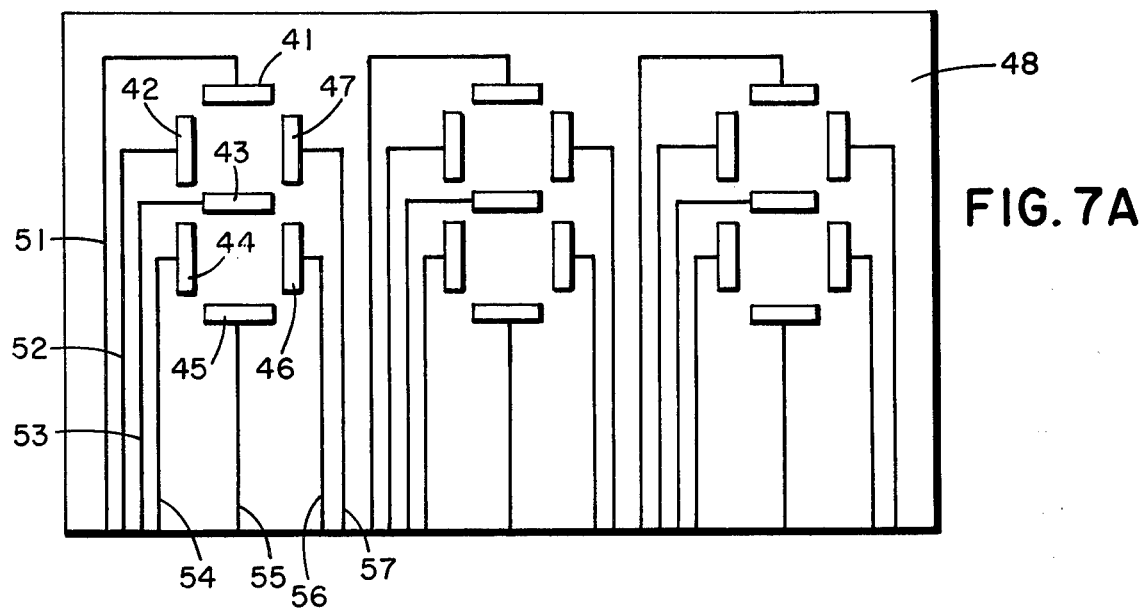
FIG. 7A shows a front view of a substrate containing strip wires in an embodiment applied to a display apparatus.
Figure 7B:
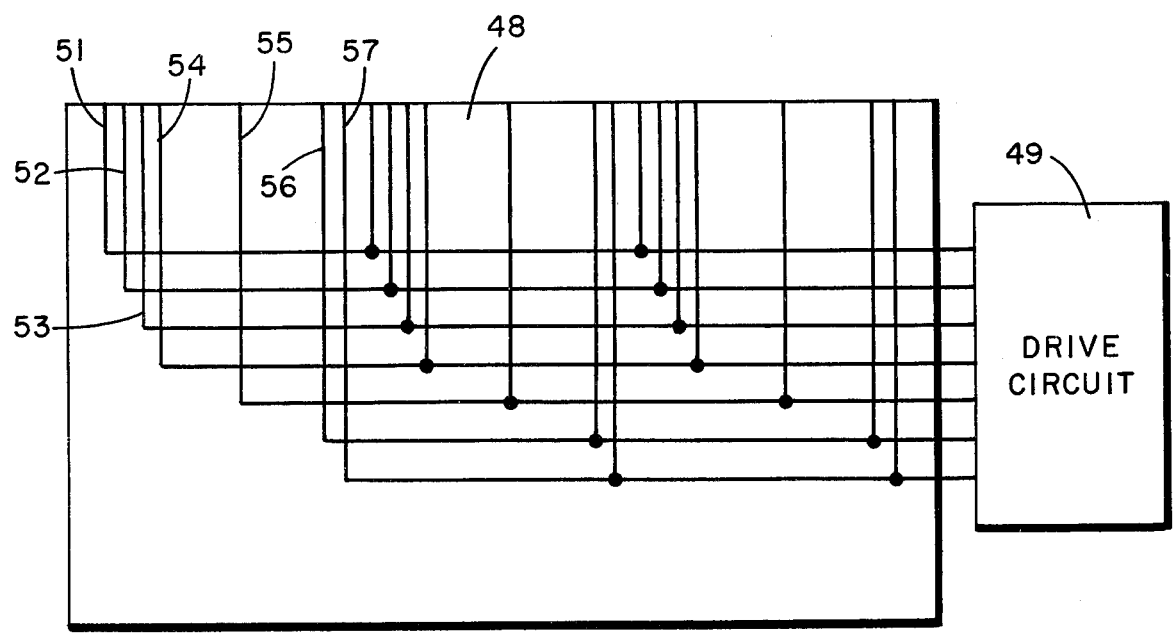
FIG. 7B shows a rear view of the embodiment of FIG. 7A.

In each of the above embodiments, the present invention is applied to thermal printing heads. However, the invention can be applied to a liquid crystal display apparatus etc. As shown in FIG. 7A, seven electrodes 41 . . . 47 are formed on the front face of a insulated substrate 48 in a figure eight. Electrodes 41 . . . 47 are connected to seven strip wires 51 . . . 57. Seven strip wires 51 . . . 57 are connected in common on the rear of insulated substrate 48 and connected to a drive circuit 49. On the other hand, three transparent electrodes 50A, 50B, 50C are formed on a transparent substrate 58. Transparent electrodes 50A, 50B, 50C are connected to strip wires 59A, 59B, 59C and connected to selective circuit 60. Liquid crystal is filled between insulated substrate 48 and transparent substrate 58. Predetermined voltage is supplied to one of transparent electrodes 50A, 50B, 50C by selective circuit 60 and another predetermined voltage is supplied to each of seven electrodes 41 . . . 47 according to parallel display signals by drive circuit 47. In this display apparatus, (Japanese patent publication No. 52-25312), strip wires 51 . . . 57 comprise leading portions 51A . . . 57A and adjusting portions 51B . . . 57B as shown in FIG. 7D. The resistivity of the adjusting portion is higher than the resistivity of the leading portion. Each adjusting portion has a different length according to the length of strip wires 51 . . . 57 and strip wires 59A, 59B, 59C.

In this embodiment, displaying images having uniform density are obtained because each adjusting portion is adjusted so that the resistance of each strip is equivalent.

In each of the above embodiments, functional elements are thermal resistive elements or displaying elements using liquid crystal. However, functional elements may be semiconductor elements or capacitor elements.

I claim:

1. A printed wiring board for recording or displaying information comprising:
   an insulated substrate;
   a plurality of functional elements placed on said insulated substrate, each of said strip wires connected to a respective functional element, and at least two of the strip wires having different lengths such that one is longer than the other, each of said strip wires comprising a first portion having a first resistivity, wherein the resistance of the second portion of said shorter strip wire is higher than the resistance of the second portion of said longer strip wire, and the resistance of the first portion of said longer strip wire is higher than the resistance of the first portion of said shorter strip wire so that the total resistance of the shorter strip wire is substantially equal to the total resistance of the longer strip wire.

2. A printed wiring board of claim 1, wherein a length of the second portion of said shorter strip wire is longer than a length of the second portion of said longer strip wire.

3. A printed wiring board of claim 1, wherein a segment of the second portion of said shorter strip wire is smaller in cross-section than the second portion of said longer strip wire.

4. A printed wiring board of claim 3, wherein a segment of said second portion of said shorter strip wire is narrower in width than the second portion of said longer strip wire.

5. A printed wiring board of claim 2, wherein said functional elements are thermal resistive elements.

6. A printed wiring board of claim 2, wherein said functional elements are liquid crystal display elements.

7. A printed wiring board of claim 4, wherein said functional elements are thermal resistive elements.

8. A printed wiring board of claim 4, wherein said functional elements are liquid crystal display elements.

9. A printed wiring board for recording information comprising:
   a substrate having a surface layer of insulated material;
   a plurality of thermal resistive elements aligned on said substrate; and,
   a plurality of strip wires formed on said substrate, each of said strip wires connected to a respective thermal resistive element, and at least two of the strip wires having different lengths such that one is longer than the other, each of said strip wires comprising a two layer portion and a single layer portion, said two layer portion comprising a lower layer having a first resistivity and an upper layer having a second resistivity which is lower than said first resistivity, said single layer portion comprising the same material used for forming said lower layer, wherein the resistance of the single layer portion of said shorter strip wire is higher than the resistance of the single layer portion of said longer strip wire, and the resistance of the double layer portion of said longer strip wire is higher than the resistance of the double layer portion of said shorter strip wire, so that the total resistance of the shorter strip wire is substantially equal to the total resistance of the longer strip wire.

10. A printed wiring board of claim 9, wherein the length of the single layer portion of said shorter strip wire is longer than the length of the single layer portion of said longer strip wire.

11. A printed wiring board of claim 9, wherein a width of the single layer portion of said shorter strip wire is narrower than a width of the single layer portion of said longer strip wire.

12. A printed wiring board of claim 9, wherein said single layer portion comprises two cross-sectional segments, wherein one of the cross-sectional segments is smaller in cross-sectional area than the other cross-sectional segment, the length of the smaller cross-sectional segment of said shorter strip wire is longer than the length of the smaller cross-sectional segment of said longer strip wire.

13. A printer wiring board of claim 9, wherein said single layer portion comprises two cross-sectional segments, wherein one of the cross-sectional segments is smaller in cross-sectional area than the other cross-sectional segment, the width of the smaller cross-sectional segment of said shorter strip wire is narrower than the width of the smaller cross-sectional segment of said longer strip wire.

14. A printed wiring board of claim 9, wherein said lower layer of said two layer portion and said single layer portion is a conductive material selected from the group consisting of Cr, Ti, V, W Nb, and Mo.

15. A printed wiring board of claim 9, wherein said upper layer of the two layer portion is a conductive material selected from the group consisting of Au, Cu, Al, Pt, and Ni.

16. A printed wiring board of claim 9, wherein the upper layer of said two layer portion comprises a layer of Au and a layer of a conductive material selected from the group consisting of Pd and Ni.

* * * * *